US009867278B2

(12) United States Patent
Hattori et al.

(10) Patent No.: US 9,867,278 B2
(45) Date of Patent: Jan. 9, 2018

(54) CAPACITOR COMPONENT AND CAPACITOR COMPONENT MOUNTING STRUCTURE

(71) Applicant: Murata Manufacturing Co., Ltd., Nagaokakyo-shi, Kyoto-fu (JP)

(72) Inventors: Kazuo Hattori, Nagaokakyo (JP); Isamu Fujimoto, Nagaokakyo (JP); Toshiki Tanaka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 9 days.

(21) Appl. No.: 13/959,938

(22) Filed: Aug. 6, 2013

(65) Prior Publication Data

US 2014/0043723 A1    Feb. 13, 2014

(30) Foreign Application Priority Data

Aug. 9, 2012 (JP) ................................ 2012-176878
May 8, 2013 (JP) ................................ 2013-098350

(51) Int. Cl.
| | |
|---|---|
| *H05K 1/02* | (2006.01) |
| *H01G 4/38* | (2006.01) |
| *H01G 4/30* | (2006.01) |
| *H01G 4/12* | (2006.01) |
| *H05K 3/34* | (2006.01) |

(Continued)

(52) U.S. Cl.
CPC .......... *H05K 1/0216* (2013.01); *H01G 2/065* (2013.01); *H01G 4/012* (2013.01); *H01G 4/12* (2013.01); *H01G 4/232* (2013.01); *H01G 4/30* (2013.01); *H01G 4/38* (2013.01); *H05K 3/3442* (2013.01);

(Continued)

(58) Field of Classification Search
CPC .......... H01G 4/012; H01G 4/232; H01G 4/30; H01G 4/38; H01G 4/12; H01G 4/065; H05K 1/0216
See application file for complete search history.

(56) References Cited

U.S. PATENT DOCUMENTS 3,304,475 A * 2/1967 Gowen .................... H01G 4/30
                                                           29/412
5,040,092 A * 8/1991 Katho et al. ............... 361/321.2
(Continued)

FOREIGN PATENT DOCUMENTS

| JP | 03139812 A | * | 6/1991 |
| JP | 04188813 A | * | 7/1992 |

(Continued)

OTHER PUBLICATIONS

Official Communication issued in corresponding Korean Patent Application No. 10-2013-0093662, dated Jul. 7, 2014.

(Continued)

*Primary Examiner* — David M Sinclair
(74) *Attorney, Agent, or Firm* — Keating & Bennett, LLP

(57) ABSTRACT

Laminated ceramic capacitors include ceramic layers and inner electrodes that are alternately laminated. The inner electrodes are laminated in the same lamination direction, and a first outer electrode and a second outer electrode are electrically connected to the inner electrodes. In a mounting process, the laminated ceramic capacitors are mounted on a mounting surface such that the inner electrodes are perpendicular or substantially perpendicular to the mounting surface.

6 Claims, 8 Drawing Sheets

(51) Int. Cl.
*H01G 2/06* (2006.01)
*H01G 4/012* (2006.01)
*H01G 4/232* (2006.01)

(52) U.S. Cl.
CPC ............ *H05K 2201/10015* (2013.01); *H05K 2201/2045* (2013.01); *Y02P 70/613* (2015.11)

(56) References Cited

U.S. PATENT DOCUMENTS

| | | | | |
|---|---|---|---|---|
| 5,835,338 | A * | 11/1998 | Suzuki et al. | 361/301.4 |
| 6,046,902 | A * | 4/2000 | Nakagawa et al. | 361/306.1 |
| 6,310,759 | B2 * | 10/2001 | Ishigaki et al. | 361/309 |
| 6,912,115 | B2 * | 6/2005 | Kobayashi | H01G 4/30 361/303 |
| 7,436,650 | B2 * | 10/2008 | Oguni et al. | 361/321.2 |
| 2004/0066605 | A1 * | 4/2004 | Trinh | H01G 4/2325 361/321.2 |
| 2007/0188975 | A1 * | 8/2007 | Togashi et al. | 361/306.3 |
| 2008/0144253 | A1 * | 6/2008 | Togashi | 361/301.4 |
| 2008/0291602 | A1 | 11/2008 | Devoe | |
| 2010/0053842 | A1 * | 3/2010 | Devoe et al. | 361/306.3 |
| 2011/0102969 | A1 * | 5/2011 | Togashi | 361/306.3 |
| 2011/0141652 | A1 * | 6/2011 | Chang | H01G 4/012 361/272 |
| 2012/0138350 | A1 * | 6/2012 | Chae | H05K 13/021 174/260 |
| 2012/0188681 | A1 * | 7/2012 | Togashi | 361/301.4 |
| 2013/0016488 | A1 * | 1/2013 | McConnell et al. | 361/774 |

FOREIGN PATENT DOCUMENTS

| | | | |
|---|---|---|---|
| JP | 4-134830 U | | 12/1992 |
| JP | 5-21429 U | | 3/1993 |
| JP | 5-74644 A | | 3/1993 |
| JP | 05090067 A | * | 4/1993 |
| JP | 08-55752 A | | 2/1996 |
| JP | 8-203768 A | | 8/1996 |
| JP | 08242136 A | * | 9/1996 |
| JP | 8-306576 A | | 11/1996 |
| JP | 2000147043 A | * | 5/2000 |
| JP | 2001-76956 A | | 3/2001 |
| JP | 2002-232110 A | | 8/2002 |
| JP | 2003-22930 A | | 1/2003 |
| JP | 2008021850 A | * | 1/2008 |
| JP | 2009-194007 A | | 8/2009 |
| JP | 2012-43947 A | | 3/2012 |

OTHER PUBLICATIONS

Hattori et al., "Mounting Land Structure and Mounting Structure for Laminated Capacitor", U.S. Appl. No. 13/959,949, filed Aug. 6, 2013.

Official Communication issued in corresponding Japanese Patent Application No. 2013-098350, dated Jul. 21, 2015.

* cited by examiner

CAPACITOR COMPONENT AND CAPACITOR COMPONENT MOUNTING STRUCTURE

BACKGROUND OF THE INVENTION

1. Field of the Invention

The present invention relates to a capacitor component and a capacitor component mounting structure including a plurality of capacitors that include inner electrodes and dielectric layers alternately laminated.

2. Description of the Related Art

A chip component, particularly a laminated ceramic capacitor, is often used in a mobile terminal device such as a cellular phone and an electronic apparatus such as a personal computer. The laminated ceramic capacitor is configured to include a substantially rectangular component body having inner electrodes and dielectric ceramics alternately laminated and outer electrodes formed on mutually facing opposite ends of the component body.

The outer electrodes are directly mounted on mounting lands of a circuit substrate of an electronic apparatus, and the mounting lands and the outer electrodes are bonded together by a bonding material such as solder. Thereby, the laminated ceramic capacitor is electrically and physically connected to the circuit substrate.

When an alternating-current voltage or a direct-current voltage superimposed with an alternating-current component is applied to such a laminated ceramic capacitor, vibration due to a mechanical strain is generated in the laminated ceramic capacitor by the piezoelectric effect and the electrostrictive effect of the dielectric ceramics. The vibration of the laminated ceramic capacitor is transmitted to the circuit substrate, and the circuit substrate vibrates. Specifically, stress in the normal direction of a mounting surface of the circuit substrate is generated in the circuit substrate by the vibration of the laminated ceramic capacitor, and the circuit substrate vibrates in the normal direction. The vibration of the circuit substrate may produce vibration sound (hereinafter referred to as acoustic noise) audible to the human ear.

As a configuration addressing this issue, Japanese Unexamined Patent Application Publication No. 8-55752, for example, describes a laminated ceramic capacitor mounted on a substrate such that the planes of inner electrodes are oriented substantially perpendicular to a mounting surface of the substrate.

The present inventors, however, have discovered that the acoustic noise of the laminated ceramic capacitor is increased in some cases even in the configuration according to the aforementioned patent application publication, if a plurality of laminated ceramic capacitors are disposed in proximity to one another. With an increase in mounting density due to a reduction in device size, there are not a few cases in which laminated ceramic capacitors are disposed in proximity to one another, and such an issue is not well addressed by the configuration described in the aforementioned patent application publication.

SUMMARY OF THE INVENTION

Accordingly, preferred embodiments of the present invention provide a capacitor component and a capacitor component mounting structure that significantly reduce or prevent acoustic noise even when using a plurality of laminates including laminated inner electrodes.

A capacitor component according to a preferred embodiment of the present invention includes a first laminate, a second laminate, at least one first outer electrode, and at least one second outer electrode. The first laminate includes a plurality of flat or substantially flat plate-shaped first inner electrode plates laminated with dielectric layers interposed therebetween. The second laminate includes a plurality of flat or substantially flat plate-shaped second inner electrode plates laminated with dielectric layers interposed therebetween. The at least one first outer electrode is provided to respective first end portions of the first laminate and the second laminate, and is electrically conductive to the first inner electrode plates and the second inner electrode plates. The at least one second outer electrode is provided to respective second end portions of the first laminate and the second laminate facing the first end portions, and is electrically conductive to the first inner electrode plates and the second inner electrode plates. The first laminate and the second laminate include the first inner electrode plates and the second inner electrode plates laminated in the same lamination direction, and are aligned along the lamination direction. In the capacitor component, a minimum distance between the first inner electrode plates and the second inner electrode plates is greater than each of an interval between adjacent ones of the first inner electrode plates and an interval between adjacent ones of the second inner electrode plates.

According to this configuration, when the capacitor component is mounted on a substrate such that the inner electrode plates (the first inner electrode plates and the second inner electrode plates) are perpendicular or substantially perpendicular to a mounting surface of the substrate, stress on the substrate due to a mechanical strain generated in the capacitor component is increased in a direction parallel or substantially parallel to the mounting surface and reduced in the normal direction of the substrate, as compared with a case in which a single laminate is mounted on the substrate. It is therefore possible to prevent the substrate from vibrating. Consequently, it is possible to reduce acoustic noise more than in a case in which a plurality of laminates are independently mounted on the substrate in proximity to one another. It is also possible to reduce the acoustic noise more than in the case in which a single laminate is mounted on the substrate.

The plurality of laminates may be configured to be integrated by one of the at least one first outer electrode and one of the at least one second outer electrode.

This configuration is also capable of reducing the acoustic noise. Further, the configuration allows the plurality of laminates to be integrally mounted on the substrate. Accordingly, it is possible to reliably reduce or prevent the acoustic noise without causing misalignment of the laminates, unlike a case in which the laminates are individually mounted on the substrate.

The at least one first outer electrode may include first regions located on the first laminate and the second laminate and bonded together in a mutually facing direction, with one of the first regions facing the first laminate adjacent thereto and the other first region facing the second laminate adjacent thereto. The at least one second outer electrode may include second regions located on the first laminate and the second laminate and bonded together in a mutually facing direction, with one of the second regions facing the first laminate adjacent thereto and the other second region facing the second laminate adjacent thereto.

This configuration is also capable of reducing the acoustic noise. Further, the configuration allows the laminates to be individually manufactured. Accordingly, the capacitor component is easily manufactured.

A capacitor component according to a preferred embodiment of the present invention includes a laminate, a first outer electrode, and a second outer electrode. The laminate includes a first laminate portion and a second laminate portion. The first laminate portion includes a plurality of flat or substantially flat plate-shaped first inner electrode plates laminated with dielectric layers interposed therebetween. The second laminate portion includes a plurality of flat or substantially flat plate-shaped second inner electrode plates laminated with dielectric layers interposed therebetween. The first laminate portion and the second laminate portion are disposed along a lamination direction of the first inner electrode plates and the second inner electrode plates and embedded in the laminate. The first outer electrode is provided to respective one end portions of the first laminate portion and the second laminate portion in a direction perpendicular or substantially perpendicular to a disposition direction of the first laminate portion and the second laminate portion, and is electrically conductive to the first inner electrode plates and the second inner electrode plates. The second outer electrode is provided to respective other end portions of the first laminate portion and the second laminate portion facing the one end portions, and is electrically conductive to the first inner electrode plates and the second inner electrode plates. In the capacitor component, a minimum distance between the first inner electrode plates and the second inner electrode plates is greater than each of an interval between adjacent ones of the first inner electrode plates and an interval between adjacent ones of the second inner electrode plates.

According to this configuration, when the capacitor component is mounted on a substrate such that the inner electrode plates (the first inner electrode plates and the second inner electrode plates) are perpendicular or substantially perpendicular to a mounting surface of the substrate, stress on the substrate due to a mechanical strain generated in the capacitor component is increased in a direction parallel or substantially parallel to the mounting surface and reduced in the normal direction of the substrate. It is therefore possible to prevent the substrate from vibrating. Consequently, it is possible to reduce acoustic noise more than in a case in which a plurality of laminates are independently mounted on the substrate in proximity to one another.

According to a preferred embodiment of the present invention, a capacitor component mounting structure includes one of the above-described capacitor components according to preferred embodiments of the present invention and a substrate mounted with the capacitor component. The capacitor component is mounted on the substrate with the planes of the first inner electrode plates and the second inner electrode plates disposed perpendicular or substantially perpendicular to a mounting surface of the substrate.

According to this configuration, the capacitor component is mounted on the substrate such that the planes of the inner electrode plates (the first inner electrode plates and the second inner electrode plates) are perpendicular or substantially perpendicular to the mounting surface of the substrate, and stress on the substrate due to a mechanical strain generated in the capacitor component is increased in a direction parallel or substantially parallel to the mounting surface and reduced in the normal direction of the substrate, as compared with a case in which a single laminate is mounted on the substrate. It is therefore possible to prevent the substrate from vibrating. Consequently, it is possible to reduce acoustic noise more than in a case in which a plurality of laminates are independently mounted on the substrate in proximity to one another. It is also possible to reduce the acoustic noise more than in the case in which a single laminate is mounted on the substrate.

According to various preferred embodiments of the present invention, the stress in the normal direction of the substrate acting on the substrate mounted with the capacitor component is reduced. It is therefore possible to significantly reduce or prevent the vibration of the substrate. Accordingly, it is possible to significantly reduce or prevent the acoustic noise of the substrate even when using a plurality of laminates.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
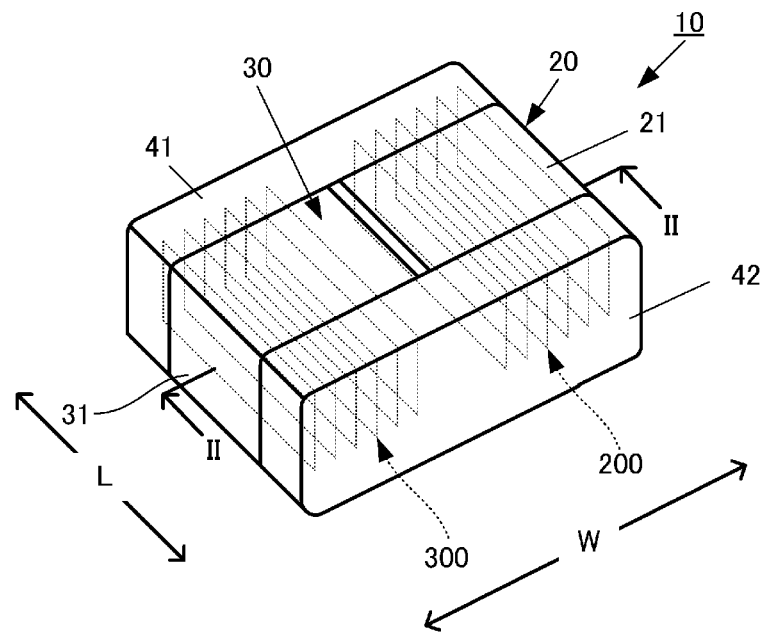
FIG. 1A is an external perspective view of a capacitor component according to a preferred embodiment of the present invention.
Figure 1B:
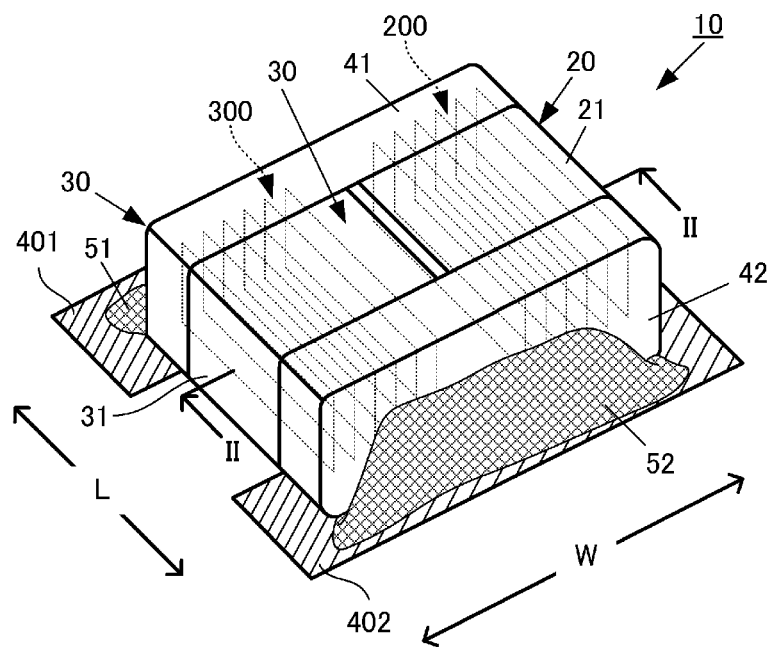
FIG. 1B is a perspective view of a mounted state of the capacitor component.
Figure 2:
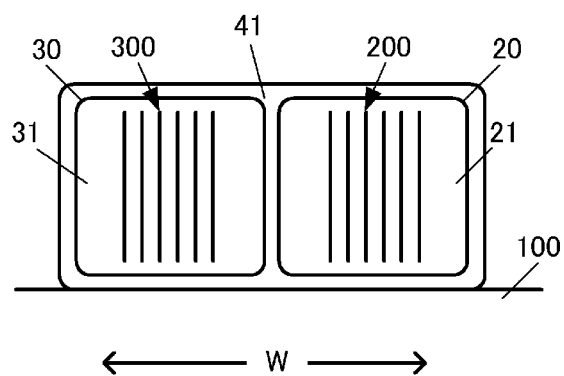
FIG. 2 is cross-sectional view of the capacitor component taken along a line II-II of FIGS. 1A and 1B.

With reference to the drawings, a capacitor component according to preferred embodiments of the present invention will be described. FIG. 1A is an external perspective view of the capacitor component according to a preferred embodiment of the present invention, and FIG. 1B is a perspective view of a capacitor component mounting structure. FIG. 2 is a cross-sectional view of the capacitor component taken along a line II-II of FIGS. 1A and 1B.

A capacitor component 10 includes two laminated ceramic capacitors 20 and 30. The laminated ceramic capacitor 20 includes a ceramic laminate 21 (first laminate) having a rectangular or substantially rectangular parallelepiped shape elongated in one direction. The ceramic laminate 21 includes a plurality of flat or substantially flat plate-shaped inner electrodes 200 (first inner electrode plates). The inner electrodes 200 and ceramic layers (dielectric layers) are alternately laminated along a direction perpendicular or substantially perpendicular to the longitudinal direction thereof (hereinafter referred to as the width direction). Further, the inner electrodes 200 include inner electrodes each exposed on one of opposite end portions thereof in the longitudinal direction and inner electrodes each exposed on the other opposite end portion, which are alternately laminated with the dielectric layers interposed therebetween. The ceramic layers (dielectric layers) preferably are ferroelectric ceramic layers mainly made of barium titanate, for example. The inner electrodes 200 are preferably made of nickel (Ni), for example.

The laminated ceramic capacitor 30 includes a ceramic laminate 31 (second laminate) having a rectangular or substantially rectangular parallelepiped shape elongated in one direction. The ceramic laminate 31 includes a plurality of flat or substantially flat plate-shaped inner electrodes 300 (second inner electrode plates). The inner electrodes 300 and ceramic layers (dielectric layers) are alternately laminated along a direction perpendicular or substantially perpendicular to the longitudinal direction thereof (hereinafter referred to as the width direction). Further, the inner electrodes 300 include inner electrodes each exposed on one of opposite end portions thereof in the longitudinal direction and inner electrodes each exposed on the other opposite end portion, which are alternately laminated with the dielectric layers interposed therebetween. The ceramic layers (dielectric layers) preferably are ferroelectric ceramics mainly made of barium titanate, for example. The inner electrodes 300 are preferably made of nickel (Ni), for example.

The laminated ceramic capacitors 20 and 30 are aligned along the width direction with the inner electrodes 200 and 300 laminated in the same lamination direction. Further, the laminated ceramic capacitors 20 and 30 are disposed such that the planes of the inner electrodes 200 and 300 are perpendicular or substantially perpendicular to a mounting surface of the capacitor component 10. Herein, the term "perpendicular" is not limited to the state in which the angle between the mounting surface and the inner electrodes 200 and 300 is 90°, and includes an acceptable range of error depending on the manufacturing or mounting accuracy of components. In the following, the longitudinal direction of the laminated ceramic capacitors 20 and 30 will be referred to as the length direction of the capacitor component 10 (direction L in the drawings), and the width direction of the laminated ceramic capacitors 20 and 30 will be referred to as the width direction of the capacitor component 10 (direction W in the drawings).

Herein, the minimum distance between the inner electrodes 200 and the inner electrodes 300 preferably is greater than each of the interval between mutually adjacent ones of the inner electrodes 200 and the interval between mutually adjacent ones of the inner electrodes 300.

Preferably, the laminated ceramic capacitors 20 and 30 are the same in outer shape, outside dimensions, material composition and thickness of the dielectric layers and the inner electrodes, and number of laminations of the inner electrodes. That is, the laminated ceramic capacitors 20 and 30 are preferably identical laminated ceramic capacitors. Herein, the term "identical" refers to a concept including manufacturing variation.

Opposite end portions in the length direction of the capacitor component 10 are provided with a first outer electrode 41 and a second outer electrode 42. The first outer electrode 41 and the second outer electrode 42 are preferably integral formed with the capacitor component 10, and are electrically conductive to the inner electrodes 200 and 300 exposed from the end portions provided with the first outer electrode 41 and the second outer electrode 42.

The first outer electrode 41 and the second outer electrode 42 are arranged on opposite end surfaces in the length direction of the capacitor component 10 to extend therefrom toward opposite end surfaces in the width direction (hereinafter referred to as the side surfaces), a top surface, and a bottom surface of the capacitor component 10. The capacitor component 10 is configured such that the laminated ceramic capacitors 20 and 30 disposed along the width direction are integrated by the first outer electrode 41 and the second outer electrode 42. More specifically, a conductive paste is integrally applied to and fired with the ceramic laminates 21 and 31 to define the first outer electrode 41 and the second outer electrode 42 as baked electrodes integral with the ceramic laminates 21 and 31. The baked electrodes preferably contain copper (Cu) and glass, for example. The ceramic laminates 21 and 31 may be in close contact with each other, or may be separated from each other by about 0.1 mm, for example. The interval between the ceramic laminates 21 and 31 is preferably about 20% or less, more preferably about 10% or less, of the dimension in the width direction of each of the ceramic laminates 21 and 31, for example.

The first outer electrode 41 and the second outer electrode 42 have a predetermined metal plating film disposed on the surfaces of the baked electrodes and provided with corrosion resistance and conductivity. That is, the metal plating film is formed to integrally surround the ceramic laminates 21 and 31 in the cross section of the capacitor component 10 in FIG. 2. The metal plating film is made of nickel, for example. Further, each of the laminated ceramic capacitors 20 and 30 is formed to have dimensions of about 3.2 mm in length by about 1.6 mm in width, about 2.0 mm in length by about 1.25 mm in width, about 1.6 mm in length by about 0.8 mm in width, about 1.0 mm in length by about 0.5 mm in width, or about 0.6 mm in length by about 0.3 mm in width, for example. Each of the laminated ceramic capacitors 20 and 30 preferably has a height equal or substantially equal in dimension to the width thereof, for example.

The capacitor component 10 is mounted on an insulating substrate 100 (see FIG. 2) made of an insulating resin such that the planes of the inner electrodes 200 and 300 are perpendicular or substantially perpendicular to the insulating substrate 100. The insulating substrate 100 includes a mounting surface including a first mounting electrode 401 and a second mounting electrode 402. The first outer electrode 41 and the second outer electrode 42 of the capacitor component 10 mounted on the insulating substrate 100 are respectively bonded to the first mounting electrode 401 and the second mounting electrode 402 by respective bonding materials 51 and 52 such as solder, for example.

The first mounting electrode 401 and the second mounting electrode 402 are arranged to face each other with a gap provided therebetween along a direction corresponding to the length direction of the mounted capacitor component 10. Further, as viewed in the normal direction of the mounting surface, the first mounting electrode 401 and the second mounting electrode 402 are arranged to at least partially overlap the first outer electrode 41 and the second outer electrode 42 of the mounted capacitor component 10. The first outer electrode 41 of the capacitor component 10 is bonded to the first mounting electrode 401 by the bonding material 51, and the second outer electrode 42 of the capacitor component 10 is bonded to the second mounting electrode 402 by the bonding material 52.

The capacitor component 10 includes the first outer electrode 41 and the second outer electrode 42 integrated therewith. In the mounting of the capacitor component 10, therefore, it is sufficient if the first outer electrode 41 and the second outer electrode 42 are at least partially connected to the first mounting electrode 401 and the second mounting electrode 402, respectively. When the capacitor component 10 is mounted on a substrate, the laminates are not misaligned, unlike a case in which the laminates are individually mounted on a substrate. Accordingly, the capacitor component 10 is easily mounted as compared with a case in which the laminated ceramic capacitors 20 and 30 are individually mounted on a substrate to mount a capacitor component thereon.

A description will be given below of a reason why the capacitor component 10 configured as described above is capable of reducing acoustic noise (squeaky noise) produced when the laminated ceramic capacitors 20 and 30 are strained.

Figure 3A:
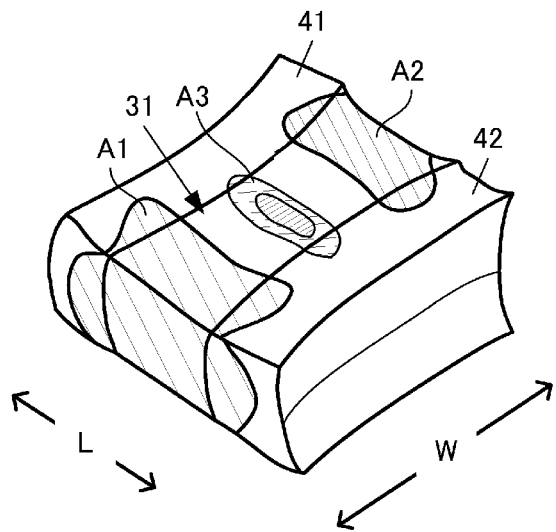
FIG. 3A is a schematic diagram for describing a strain of laminated ceramic capacitors.
Figure 3B:
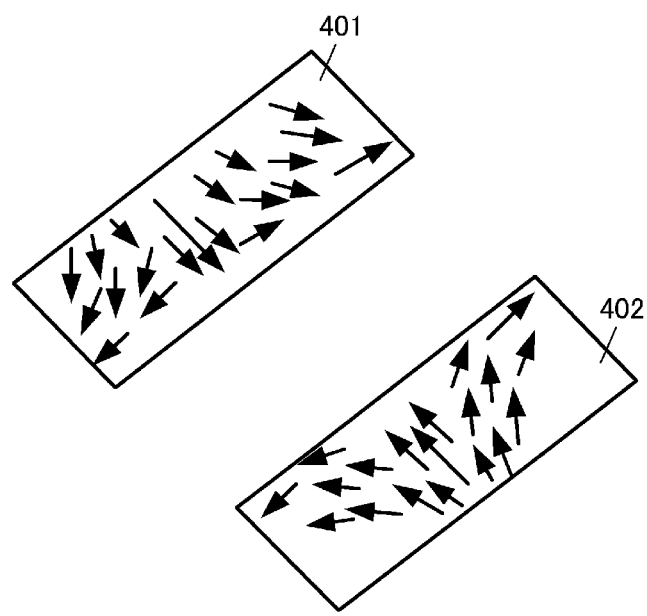
FIG. 3B is a schematic diagram illustrating stress generated in a first mounting electrode and a second mounting electrode when the laminated ceramic capacitors are strained.

FIG. 3A is a schematic diagram for describing a strain of the laminated ceramic capacitors 20 and 30. FIG. 3B is a schematic diagram illustrating stress generated in the first mounting electrode 401 and the second mounting electrode 402 when the laminated ceramic capacitors 20 and 30 are strained.

When applied with a voltage, each of the laminated ceramic capacitors 20 and 30 expands outward along the width direction and contracts inward along the length direction owing to the piezoelectric effect and the electrostrictive effect of ceramics.

The capacitor component 10 is configured to have the laminated ceramic capacitors 20 and 30 aligned along the width direction. Therefore, respective one end portions of the laminated ceramic capacitors 20 and 30 expanding in the width direction correspond to opposite end portions of the capacitor component 10 facing each other in the width direction (regions A1 and A2 in the drawing), and respective other end portions of the laminated ceramic capacitors 20 and 30 correspond to a central portion in the width direction of the capacitor component 10 (a region A3 in the drawing).

In the regions A1 and A2, the capacitor component 10 expands in the width direction. The region A3 is a portion in which the laminated ceramic capacitors 20 and 30 are bonded together and the respective end portions of the laminated ceramic capacitors 20 and 30 expand in opposite directions along the width direction. Therefore, the displacement amount in the region A3 is small. Further, the capacitor component 10 contracts inward along the length direction, similarly to the laminated ceramic capacitors 20 and 30.

As indicated by arrows illustrated in FIG. 3B, stress is generated in the first mounting electrode 401 and the second mounting electrode 402 mounted with the capacitor component 10, which expands and contracts as described above. Since the capacitor component 10 expands outward along the width direction, the first mounting electrode 401 and the second mounting electrode 402 are pulled outward. Further, since the capacitor component 10 contracts inward along the length direction, the first mounting electrode 401 and the second mounting electrode 402 are pulled toward each other.

In the insulating substrate 100 (see FIG. 2) including the first mounting electrode 401 and the second mounting electrode 402 in which the stress illustrated in FIG. 3B is generated, the stress is increased in a direction parallel or substantially parallel to the mounting surface and reduced in the normal direction of the mounting surface, as compared with a case in which a single laminate is mounted on the insulating substrate 100. That is, the direction of the stress changes. The acoustic noise tends to be produced when the surface of the insulating substrate 100 vibrates in the normal direction. Since the stress in the normal direction remains small irrespective of the expansion and contraction of the capacitor component 10, the vibration in the normal direction of the surface of the insulating substrate 100 is small. Accordingly, it is possible to significantly reduce or prevent the acoustic noise. The shorter the interval between the ceramic laminates 21 and 31 is, the smaller the stress in the normal direction is, and the more effectively the acoustic noise is reduced. Therefore, the interval between the ceramic laminates 21 and 31 is preferably about 20% or less, more preferably about 10% or less, of the dimension in the width direction of each of the ceramic laminates 21 and 31, for example.

With a reduction in device size, it is necessary to downsize components to be mounted on or in a device, or to highly densely mount a plurality of components on or in a device. In such a case, the capacitor component 10 described in the present preferred embodiment achieves higher-density mounting than a configuration which independently mounts a plurality of laminated ceramic capacitors, and significantly reduces or prevents the acoustic noise irrespective of the high-density mounting.

A description will now be given of a plurality of modified examples of the capacitor component 10 according to the present preferred embodiment.

First Modified Example

Figure 4A:
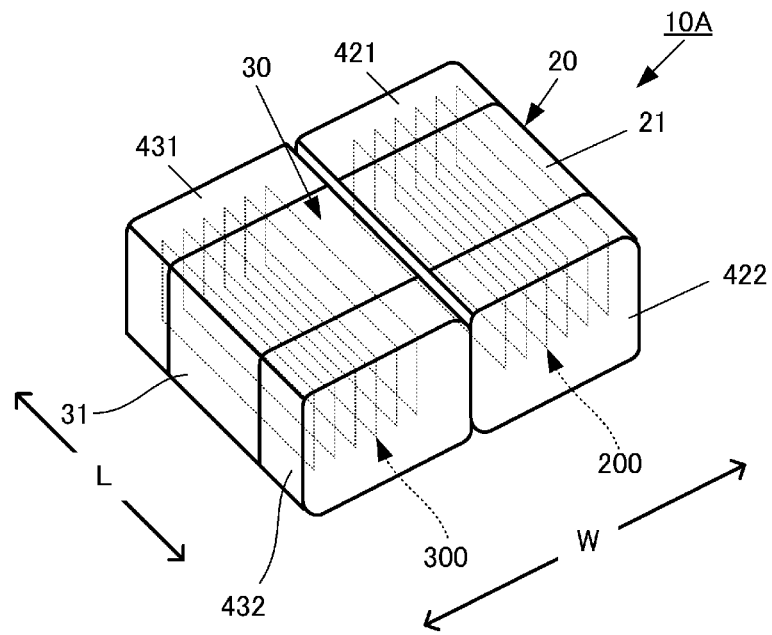
FIG. 4A is an external perspective view of another configuration example of the capacitor component.
Figure 4B:
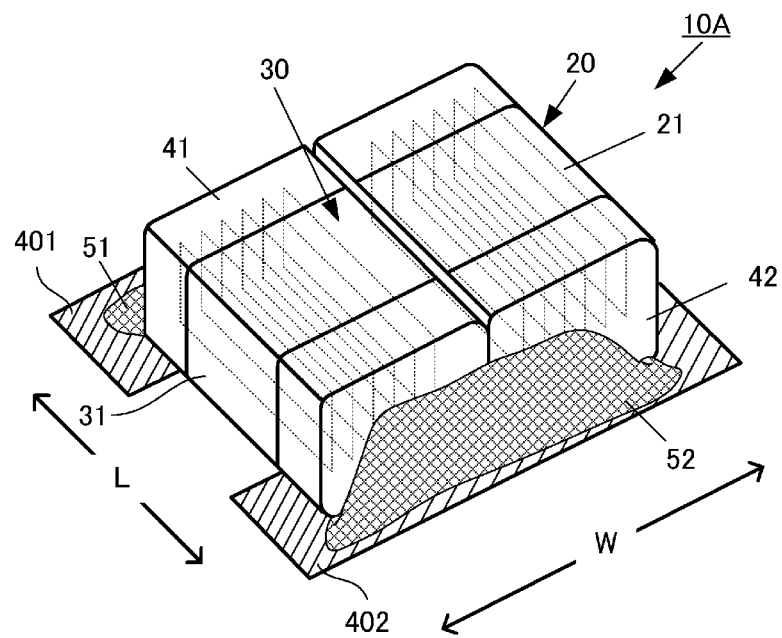
FIG. 4B is a perspective view of a capacitor component mounting structure.

FIG. 4A is an external perspective view of another configuration example of the capacitor component 10, and FIG. 4B is a perspective view of a mounted state of a capacitor component 10A.

In the above-described capacitor component 10, the laminated ceramic capacitors 20 and 30 are integrally provided with the first outer electrode 41 and the second outer electrode 42. Meanwhile, in the capacitor component 10A illustrated in FIGS. 4A and 4B, the laminated ceramic capacitor 20 is provided with a first outer electrode 421 and a second outer electrode 422, and the laminated ceramic capacitor 30 is provided with a first outer electrode 431 and a second outer electrode 432.

As illustrated in FIG. 4B, the laminated ceramic capacitors 20 and 30 are integrally mounted on a substrate by the bonding materials 51 and 52. In this case, the first outer electrode 421 of the laminated ceramic capacitor 20 and the first outer electrode 431 of the laminated ceramic capacitor 30 are bonded together at mutually facing surfaces thereof (first regions according to a preferred embodiment of the present invention) located on side surfaces of the ceramic laminates 21 and 31. Further, the second outer electrode 422 of the laminated ceramic capacitor 20 and the second outer electrode 432 of the laminated ceramic capacitor 30 are bonded together at mutually facing surfaces thereof (second regions according to a preferred embodiment of the present invention) located on the side surfaces of the ceramic laminates 21 and 31. It is thus possible to realize a structure similar to the above-described structure integrated with the outer electrodes.

The bonding materials 51 and 52 used for the mounting may be the same as or different from a bonding material for bonding the outer electrodes together. Further, the bonding material used to bond the outer electrodes together is not limited to a conductive material, and may be an insulating material.

Further, the laminated ceramic capacitors 20 and 30 may previously be bonded together to define the capacitor component 10A, and thereafter the capacitor component 10A may be mounted on a substrate. Alternatively, the laminated ceramic capacitors 20 and 30 may separately be mounted on a substrate, and thereafter the capacitor component 10A may be provided on the substrate.

If the laminated ceramic capacitors 20 and 30 are separately mounted on a substrate, the laminated ceramic capacitors 20 and 30 are capable of approaching each other by self-alignment during the mounting on the substrate to the fixing thereto. To more effectively exhibit such self-alignment, the geometrical dimensions of the first mounting electrode 401 (particularly the dimension thereof in the width direction W) are preferably substantially similar to or slightly less than the geometrical dimensions of the combined mounting surfaces of the first outer electrodes 421 and 431 of the capacitor component 10A. Further, the geometrical dimensions of the second mounting electrode 402 (particularly the dimension thereof in the width direction W) are preferably substantially similar to or slightly less than the geometrical dimensions of the combined mounting surfaces of the second outer electrodes 422 and 432 of the capacitor component 10A.

Meanwhile, laminated ceramic capacitors are respectively stored in a plurality of cavities of an elongated package, and are extracted one by one from the package to be mounted on a substrate. Herein, if each of the laminated ceramic capacitors has equal width and height, the laminated ceramic capacitors are normally stored in the package with the inner electrodes not oriented in the same direction. Further, if the laminated ceramic capacitors are greater in height than in width (thickness in the lamination direction), the laminated ceramic capacitors are normally stored in the package with the planes of the inner electrodes disposed parallel or substantially parallel to a bottom surface of the package.

Preferably, the laminated ceramic capacitors having such shapes are previously stored and maintained in the package as oriented in the same direction such that the planes of the inner electrodes are perpendicular or substantially perpendicular to bottom surfaces of the cavities. With this configuration, it is possible to mount the laminated ceramic capacitors on the substrate such that the inner electrodes of the laminated ceramic capacitors are oriented in the same lamination direction, and that the planes of the inner electrodes are perpendicular or substantially perpendicular to the substrate.

In the capacitor component 10A illustrated in FIG. 4A, the laminated ceramic capacitors 20 and 30 are respectively provided with the outer electrodes and individually manufacturable. Accordingly, the capacitor component 10A is easily manufactured. It is sufficient if the mutually facing first regions of the first outer electrodes 421 and 431 of the laminated ceramic capacitors 20 and 30 are at least partially bonded together, and if the mutually facing second regions of the second outer electrodes 422 and 432 of the laminated ceramic capacitors 20 and 30 are at least partially bonded together. Preferably, the first regions and the second regions are bonded together at the center thereof. To reduce the acoustic noise, the first regions and the second regions are preferably reliably bonded together. The first regions and the second regions are bonded together in preferably about 30% or more, more preferably about 50% or more, of the area thereof including the center, for example. Further, it is sufficient if the mutually facing surfaces of the outer electrodes are at least partially bonded together. The ceramic laminates 21 and 31 may be in close contact with each other, or may be separated from each other by about 0.1 mm, for example. The interval between the ceramic laminates 21 and 31 is preferably about 20% or less, more preferably about 10% or less, of the dimension in the width direction of each of the ceramic laminates 21 and 31, for example.

Second Modified Example

Figure 5A:
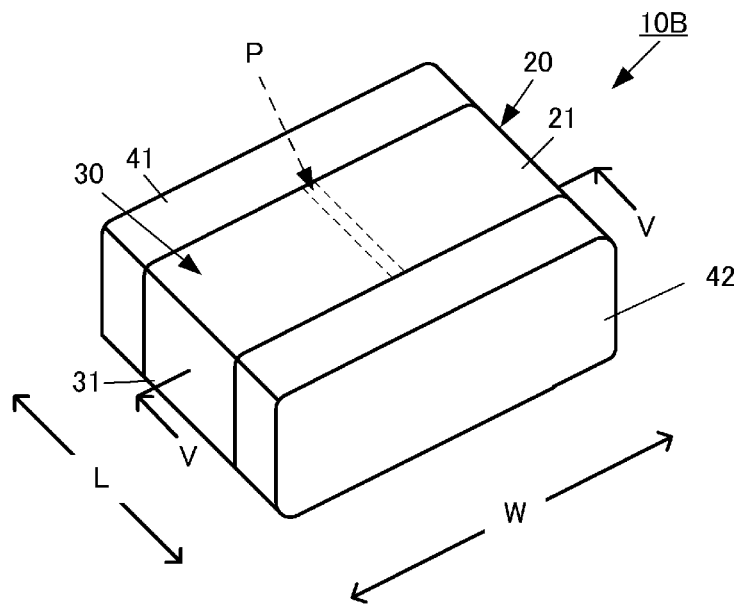
FIG. 5A is an external perspective view of another configuration example of the capacitor component.
Figure 5B:
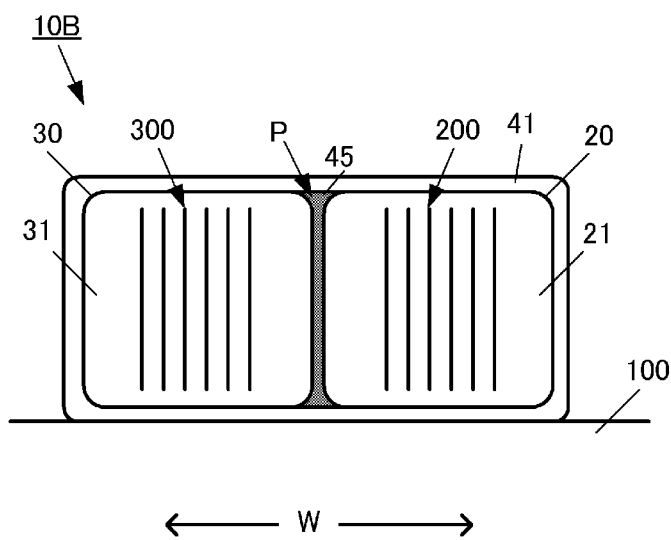
FIG. 5B is a cross-sectional view taken along a line V-V of FIG. 5A.

FIG. 5A is an external perspective view of another configuration example of the capacitor component 10, and FIG. 5B is a cross-sectional view taken along a line V-V of FIG. 5A. In FIG. 5A, the inner electrodes 200 and 300 are omitted.

A capacitor component 10B illustrated in FIG. 5A includes the laminated ceramic capacitors 20 and 30, the first outer electrode 41, and the second outer electrode 42. In the bonding of the laminated ceramic capacitors 20 and 30, a space P is provided between the ceramic laminate 21 of the laminated ceramic capacitor 20 and the ceramic laminate 31 of the laminated ceramic capacitor 30, as illustrated in FIG. 5A. In the capacitor component 10B, the space P is filled with ceramics 45. The capacitor component 10B is similar to the capacitor component 10 in the other configurations. The space P may be filled with an insulating material, such as a thermosetting or photo-curing resin.

Third Modified Example

Figure 6:
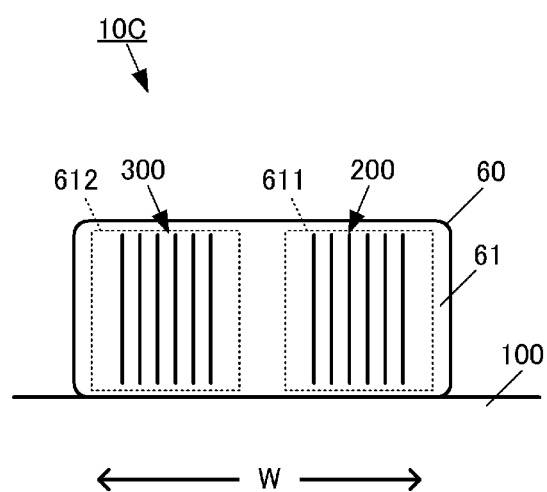
FIG. 6 is a cross-sectional view of another configuration example of the capacitor component.

FIG. 6 is a cross-sectional view of another configuration example of the capacitor component 10. In FIG. 6, which corresponds to FIG. 2, the lateral direction in the drawing corresponds to the width direction of a capacitor component 10C.

While the foregoing capacitor component 10 preferably includes the laminated ceramic capacitors 20 and 30 bonded together, the capacitor component 10C illustrated in FIG. 6 includes one laminated ceramic capacitor 60. The laminated ceramic capacitor 60 has a size corresponding to the laminated ceramic capacitors 20 and 30 bonded together.

The laminated ceramic capacitor 60 includes a ceramic laminate 61. The ceramic laminate 61 includes a laminate portion 611 (first laminate portion) including the laminated inner electrodes 200 and a laminate portion 612 (second laminate portion) including the laminated inner electrodes 300. The laminate portions 611 and 612 are integrated such that the inner electrodes 200 and 300 have the same lamination direction. Further, the laminate portions 611 and 612 are separated from each other by a predetermined distance with a ceramic layer (dielectric layer) provided therebetween. Specifically, the minimum distance between the inner electrodes 200 and the inner electrodes 300 is greater than each of the interval between mutually adjacent ones of the inner electrodes 200 and the interval between mutually adjacent ones of the inner electrodes 300. The lamination direction of the inner electrodes 200 and 300 corresponds to the width direction (direction W in the drawing) of the capacitor component 10C. The capacitor component 10C is similar to the capacitor component 10 in the other configurations including the outer electrodes.

The distance between the laminate portions 611 and 612 is appropriately changeable in accordance with, for example, the desired capacitance of the capacitor component 10C. Further, with the distance appropriately changed and set, it is possible to more effectively prevent the vibration.

A description will now be given of respective acoustic noise reduction effects of the capacitor components 10, 10A, 10B, and 10C according to the preferred embodiments of the present invention.

Figure 7:
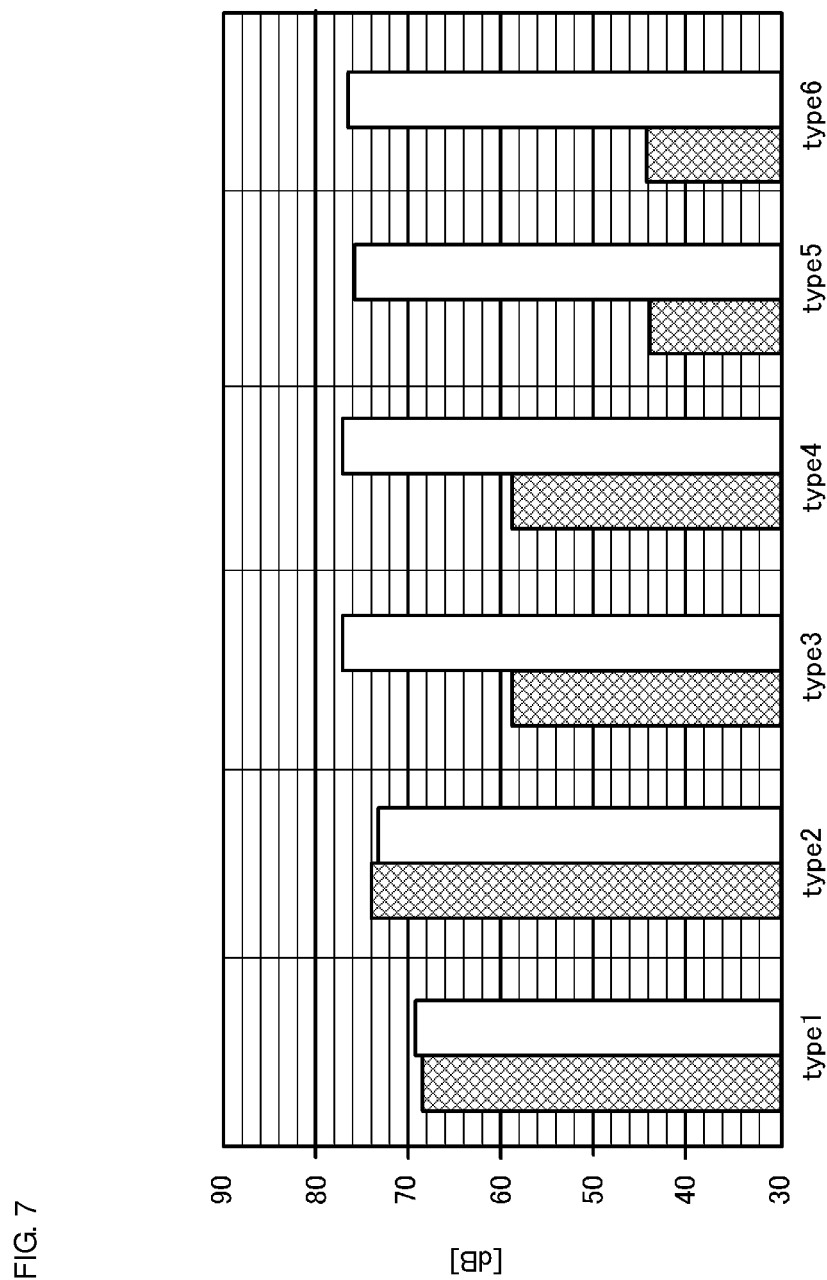
FIG. 7 is a diagram illustrating simulation results of the measurement of acoustic noise of capacitor components.

FIG. 7 is a diagram illustrating simulation results of the measurement of acoustic noise of the capacitor components 10, 10A, 10B, and 10C. The vertical axis of FIG. 7 represents the noise level [dB].

In FIG. 7, "type 1" represents the acoustic noise in a case using one laminated ceramic capacitor, and "type 2" represents the acoustic noise in a case using two laminated ceramic capacitors independently disposed on an insulating substrate to be separated from each other by about 0.1 mm, for example. Further, "type 3" represents the acoustic noise in a case using the capacitor component 10A described in the first modified example, and "type 4" represents the acoustic noise in a case using the capacitor component 10 illustrated in FIGS. 1A and 1B and so forth. Further, "type 5" represents the acoustic noise in a case using the capacitor component 10B described in the second modified example, and "type 6" represents the acoustic noise in a case using the capacitor component 10C described in the third modified example.

Further, FIG. 7 illustrates, for each of the types, the acoustic noise of the electronic component having the planes of the inner electrodes disposed perpendicular or substantially perpendicular to the mounting surface (shaded graph) and the acoustic noise of the electronic component having the planes of the inner electrodes disposed parallel or substantially parallel to the mounting surface (white graph).

In "type 1," the acoustic noise maintains substantially the same noise level irrespective of whether the planes of the inner electrodes are perpendicular or substantially perpendicular or parallel or substantially parallel to the mounting surface. In "type 2," the acoustic noise level is higher than in the case using one laminated ceramic capacitor in both the configuration having the planes of the inner electrodes disposed perpendicular or substantially perpendicular to the mounting surface and the configuration having the planes of the inner electrodes disposed parallel or substantially parallel to the mounting surface.

In the capacitor component 10A of "type 3" and the capacitor component 10 of "type 4," the acoustic noise is lower than in "type 1" and "type 2" by about 10 dB to about 15 dB in the case having the planes of the inner electrodes 200 and 300 of the capacitor component 10A or 10 disposed perpendicular or substantially perpendicular to the mounting surface. Further, in this case, the acoustic noise is lower by about 20 dB than in the case having the planes of the inner electrodes 200 and 300 of the capacitor component 10A or 10 disposed parallel or substantially parallel to the mounting surface.

In the capacitor component 10B of "type 5," the acoustic noise is lower than in "type 1" and "type 2" by about 20 dB to about 30 dB in the case having the planes of the inner electrodes 200 and 300 of the capacitor component 10B disposed perpendicular or substantially perpendicular to the mounting surface. Further, in this case, the acoustic noise is lower by about 30 dB than in the case having the planes of the inner electrodes 200 and 300 of the capacitor component 10B disposed parallel or substantially parallel to the mounting surface.

In the capacitor component 10C of "type 6," the acoustic noise is lower than in "type 1" and "type 2" by about 20 dB to about 30 dB in the case having the planes of the inner electrodes 200 and 300 of the capacitor component 10C disposed perpendicular or substantially perpendicular to the mounting surface. Further, in this case, the acoustic noise is lower by about 30 dB than in the case having the planes of the inner electrodes 200 and 300 of the capacitor component 10C disposed parallel or substantially parallel to the mounting surface.

As described above, in the capacitor component 10 according to the present preferred embodiment and the capacitor components 10A, 10B, and 10C as modified examples thereof, it is possible to reduce the acoustic noise more than in the case having laminated ceramic capacitors simply aligned. It is also possible to reduce the acoustic noise more than in the case using one laminated ceramic capacitor. Further, in the capacitor components 10, 10A, 10B, and 10C, it is possible to reduce the acoustic noise more than in the configuration having the planes of the inner electrodes 200 and 300 disposed parallel or substantially parallel to the mounting surface. Further, it is possible to perform high-density mounting of a plurality of laminated ceramic capacitors, while ensuring the reduction in acoustic noise.

In the description of the foregoing preferred embodiments, the capacitor component 10 preferably includes the two laminated ceramic capacitors 20 and 30. The capacitor component 10, however, may include three or more laminated ceramic capacitors, for example.

Figure 8:
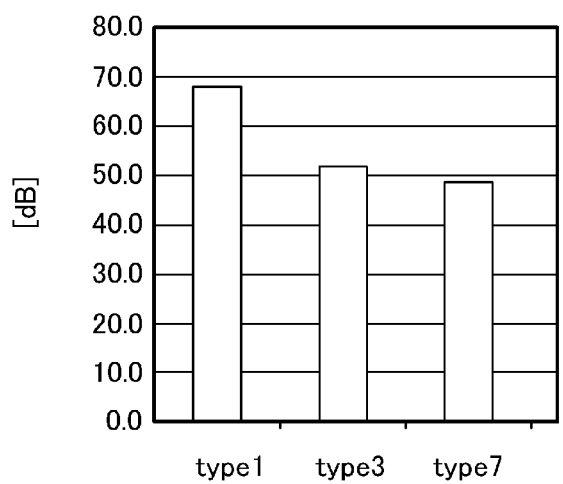
FIG. 8 is a diagram illustrating results of the measurement of acoustic noise.

FIG. 8 is a diagram illustrating results of the measurement of acoustic noise. Herein, "type 1" represents the measurement result of acoustic noise in a case using one laminated ceramic capacitor, similarly to "type 1" of FIG. 7, and "type 3" represents the measurement result of acoustic noise in a case using the capacitor component 10A described in the first modified example, similarly to "type 3" of FIG. 7. Further, "type 7" represents the measurement result of acoustic noise in a case using a capacitor component including three laminated ceramic capacitors. The vertical axis of FIG. 8 represents the noise level [dB]. In FIG. 8, "type 7" represents the acoustic noise in a case in which three laminated ceramic capacitors are disposed on an insulating substrate with the ceramic laminates spaced from one another by about 0.1 mm and the adjacent outer electrodes bonded together, for example. FIG. 8 also illustrates the acoustic noises of "type 1" and "type 3" illustrated in FIG. 7. Further, each of the laminated ceramic capacitors is a component having dimensions of about 1 mm in the length direction L, about 0.5 mm in the width direction W, and about 0.5 mm in the height direction and a capacitance of about 10 μF, for example. Further, the laminated ceramic capacitors are all mounted on the mounting surface of the substrate such that the planes of the inner electrodes are perpendicular or substantially perpendicular to the mounting surface.

In FIG. 8, the acoustic noise is lower in "type 3" than in "type 1" by about 15 dB, which indicates that there is a correspondence in tendency between the simulation results illustrated in FIG. 7 and the measurement results. Further, the acoustic noise of the capacitor component is lower in "type 7" than in "type 3" by a few a few decibels. Accordingly, the capacitor component including three laminated ceramic capacitors is capable of reducing the acoustic noise more than the configuration including two laminated ceramic capacitors. Therefore, the capacitor component may include three or more laminated ceramic capacitors. To reduce the vibration of the substrate by changing the direction of the above-described stress, the planes of the inner electrodes are disposed perpendicular or substantially perpendicular to the mounting surface of the substrate in at least two adjacent laminated ceramic capacitors in the capacitor component including three or more laminated ceramic capacitors. It is thus possible to significantly reduce or prevent the acoustic noise. Further, as obvious from the measurement results of FIG. 8, it is more preferable that the planes of the inner electrodes are disposed perpendicular or substantially perpendicular to the mounting surface of the substrate in all of the laminated ceramic capacitors.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A capacitor component comprising:
    a first laminate including a plurality of flat or substantially flat plate-shaped first inner electrode plates laminated with dielectric layers interposed therebetween, and alternately extending to and being exposed at first and second end portions of the first laminate;
    a second laminate including a plurality of flat or substantially flat plate-shaped second inner electrode plates laminated with dielectric layers interposed therebetween, and alternately extending to and being exposed at first and second end portions of the second laminate;
    at least one first outer electrode provided on the respective first end portions of the first laminate and the second laminate, and electrically connected to the first inner electrode plates and the second inner electrode plates exposed at the first end portions of the first and second laminates; and
    at least one second outer electrode provided on the respective second end portions of the first laminate and the second laminate facing the first end portions and electrically connected to the first inner electrode plates and the second inner electrode plates exposed at the second end portions of the first and second laminates; wherein
    the first laminate is a separate and distinct component from the second laminate, and an outermost surface of the first laminate is disposed adjacent to an outermost surface of the second laminate such that the first laminate and the second laminate are arranged horizontally along a width direction of the capacitor component that corresponds to a lamination direction of the first laminate and the second laminate;
    the respective first end portions and the respective second end portions of the first laminate and the second laminate oppose each other in a length direction of the capacitor component;
    the first laminate and the second laminate include the first inner electrode plates and the second inner electrode plates laminated in the same lamination direction, and are aligned along the lamination direction;
    a minimum distance between the first inner electrode plates and the second inner electrode plates is greater than each of an interval between adjacent ones of the first inner electrode plates and an interval between adjacent ones of the second inner electrode plates;
    planes of the first inner electrode plates and the second inner electrode plates are perpendicular or substantially perpendicular to a mounting surface of the capacitor component;
    a total width of the capacitor component in the width direction is equal to or greater than a total length of the capacitor component in the length direction;
    the first laminate and the second laminate have the same outer shape, outside dimensions, material composition and thickness of the dielectric layers and the inner electrode plates, and number of the inner electrode plates;
    a space is provided between the first laminate and the second laminate;
    each of the first laminate and the second laminate has a height that is equal or substantially equal to a width thereof; and
    an interval between the first laminate and the second laminate is about 10% or less of the width of each of the first and second laminates.

2. The capacitor component according to claim 1, wherein the first laminate and the second laminate are integrated by one of the at least one first outer electrode and one of the at least one second outer electrode.

3. A capacitor component mounting structure comprising:
    the capacitor component according to claim 2; and
    a substrate mounted with the capacitor component; wherein
    the capacitor component is mounted on the substrate with the planes of the first inner electrode plates and the second inner electrode plates disposed perpendicular or substantially perpendicular to a mounting surface of the substrate.

4. The capacitor component according to claim 1, wherein
    the at least one first outer electrode includes first regions located on the first laminate and the second laminate and bonded together in a mutually facing direction, one of the first regions facing the first laminate adjacent thereto and the other first region facing the second laminate adjacent thereto; and
    the at least one second outer electrode includes second regions located on the first laminate and the second laminate and bonded together in a mutually facing direction, one of the second regions facing the first laminate adjacent thereto and the other second region facing the second laminate adjacent thereto.

5. A capacitor component mounting structure comprising:
    capacitor component according to claim 4; and
    a substrate mounted with the capacitor component; wherein
    the capacitor component is mounted on the substrate with the planes of the first inner electrode plates and the second inner electrode plates disposed perpendicular or substantially perpendicular to a mounting surface of the substrate.

6. A capacitor component mounting structure comprising:
    the capcitor component according to claim 1; and
    a substrate mounted with the capacitor component; wherein
    the capacitor component is mounted on the substrate with the planes of the first inner electrode plates and the second inner electrode plates disposed perpendicular or substantially perpendicular to a mounting surface of the substrate.

* * * * *